Figure 1:
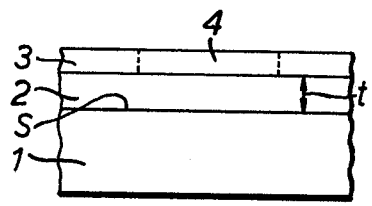

United States Patent [19]

Godber

[11] 4,084,987
[45] Apr. 18, 1978

[54] METHOD FOR MANUFACTURING ELECTRICAL SOLID STATE DEVICES UTILIZING SHADOW MASKING AND ION-IMPLANTATION

[75] Inventor: Geoffrey Allan Godber, Long Buckby, England

[73] Assignee: Plessey Handel und Investments A.G., Zug, Switzerland

[21] Appl. No.: 726,796

[22] Filed: Sep. 27, 1976

[30] Foreign Application Priority Data

Sep. 27, 1975 United Kingdom ............... 39669/75

[51] Int. Cl.² ................. H01L 21/265; H01L 21/31
[52] U.S. Cl. ........................................ 148/1.5; 29/578; 29/579; 148/187; 148/188; 148/190; 156/643; 156/644; 156/655; 156/657; 156/659; 156/662; 357/23; 357/91
[58] Field of Search ............... 148/1.5, 187, 188, 190; 156/651–653, 655, 659, 662, 643, 644, 657; 29/578, 579; 357/23, 91

[56] References Cited

U.S. PATENT DOCUMENTS

| 3,523,042 | 8/1970 | Bower et al. | 148/1.5 |
|---|---|---|---|
| 3,537,925 | 11/1970 | Chen | 156/659 |
| 3,676,230 | 7/1972 | Rice | 148/188 X |
| 3,758,943 | 9/1973 | Shibata | 29/579 X |
| 3,866,310 | 2/1975 | Driver et al. | 29/579 X |
| 3,940,288 | 2/1976 | Takagi et al. | 148/1.5 |
| 3,964,156 | 6/1976 | Williams et al. | 29/579 |
| 3,972,756 | 8/1976 | Nagase et al. | 148/187 X |
| 3,980,508 | 9/1976 | Takamiya et al. | 148/188 |

FOREIGN PATENT DOCUMENTS 1,388,535  3/1975  United Kingdom.

OTHER PUBLICATIONS

Carlsen, G.S., "Multiple Division for Integrated . . . Diffusion", I.B.M. Tech. Discl. Bull., vol. 9, No. 10, Mar. 1967, pp. 1456-1457.

Primary Examiner—L. Dewayne Rutledge
Assistant Examiner—W. G. Saba
Attorney, Agent, or Firm—Fleit & Jacobson

[57] ABSTRACT

The present invention describes the manufacture of a chip having a stratum in which a number of diffusions are spaced from each other by boundaries whose widths is the width of a gap. The diffusion on one side of a boundary is formed by ion bombardment, and that on the other side by heat transfer of ions of a material with which the film has been doped.

3 Claims, 14 Drawing Figures

METHOD FOR MANUFACTURING ELECTRICAL SOLID STATE DEVICES UTILIZING SHADOW MASKING AND ION-IMPLANTATION

This invention relates to electrical solid state devices. More specifically, this invention relates to a method of manufacturing the devices and to the devices when so manufactured.

In this specification the term "stratum" is used to denote either a substrate or a layer or film supported directly or indirectly by the substrate.

British patent specification No. 1,388,535 discloses how to make, on the surface of a stratum, a film which is divided into a number of lands by narrow demarcation gaps. A gap is formed by controlled under-mining of a film of etch-resist, so as to expose the surface of the stratum at a margin which is overhung by the resist. In British patent specification No. 36048/75, the film is made of mask material. After removal of the overhanging etch-resist, a margin serves as the aperture of the mask. The mask is used conventionally. The part of the stratum surface which is exposed at the margin is subjected to treatment, from which the remainder of the surface is shielded.

According to the invention there is provided a method of manufacturing an electrical solid state device having a stratum presenting a surface at which the stratum is to be subjected to an implantation treatment, which method comprises the following six stages:

(i) forming a film on the said surface, the material of the film being doped with ions of a substance to be difused in the stratum, (ii) covering the film with a layer of photo-resist;

(iii) photographically exposing a trace of at least one channel on the layer, and removing exposed resist from the trace to leave at least one channel having walls constituted by defined edges of photo-resist and a floor of film material;

(iv) forming a trough in the film material by introducing an etchant into the or each channel whereby an etching action is started on the film material at the floor of the or each channel, which action continues through the film thickness until such time as said surface is exposed over a width equal to the width between said defined edges, an incidental action taking place during this time at the walls of the trough which incidental action is deliberately continued after the expiry of said time for a period during which the trough walls are caused to recede and to assume a profile dependent partly on the period duration and partly on the film thickness, the recession of a wall forming at the floor of the trough a margin at which said surface is uncovered and which is overhung by photo-resist;

(v) bombarding said surface, from a source above the said surface and the photo-resist, with ions of a substance to be implanted in the stratum, whereby the uncovered non-overhung stratum undergoes implantation by the bombarding ions; and (vi) heating the stratum and the surviving film material whereby, firstly ions of the dopant substance are transferred from the film material to the stratum and are implanted therein, and secondly ions, implanted either by bombardment or by transfer, are caused to diffuse into the stratum except at any said margin where no implanted ions will be present, thereby forming in the stratum a number of individual diffusions, any two of which are separated from each other by a boundary wall of stratum material whose width is the width of a margin.

The pattern produced on the surface of the stratum by this method is the inverse of that produced by the known masking method already mentioned. In the known method, a margin serves as an aperture of the mask at which the stratum surface is subjected to treatment. In the method according to the invention, the margin is shielded from bombarding ions by the overhanging etch-resist, and is not accessible to ions transferred from the film material. Consequently the margin becomes the only part of the stratum surface which is not subjected to treatment.

Preferably, the method of the invention is such that an oxide film is first provided on the stratum and is then locally removed to expose the surface of the stratum which receives the film of the material as in method stage (i) above. This enables the surface of the stratum to receive the film of the material to be precisely defined. The oxide film will usually be a known thermal oxide film.

Advantageously, after method stage (v) above, the photo-resist is removed, for example with fusing nitric acid of the formula $HNO_3 NO_2$. The heating of method stage (vi) above can then be continued. If the photoresist is not removed and with some heating temperatures, care may have to be taken to avoid contamination of the electrical solid state device.

The width of the margins and boundary walls obtainable by the method according to the invention is advantageously of the same order as the width of margin attainable in accordance with the two specifications already mentioned.

If only one margin is required, then one wall of a single trough can be removed before the surface bombarding takes place.

Most probably, though not necessarily, the ions with which the stratum surface is bombarded are ions of the same substance as is used to dope the film material. The ions may be, for example of phosphorus, boron or arsenic or, more generally, any $p$ or $n$ dopant for silicon.

Figure 2:
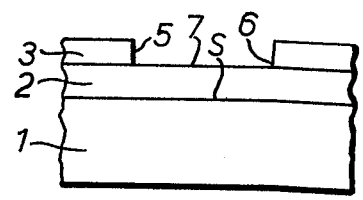
Figure 3:
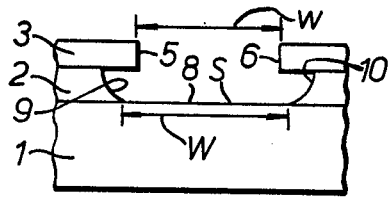
Figure 4:
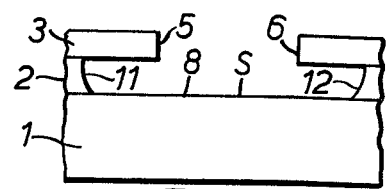
Figure 5:
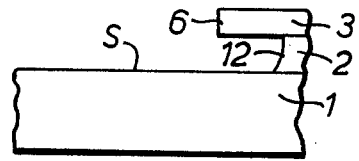
Figure 6:
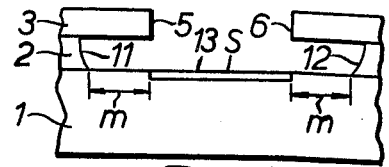
Figure 7:
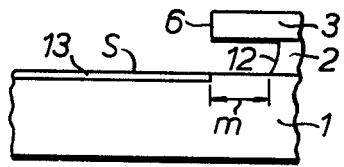
Figure 10:
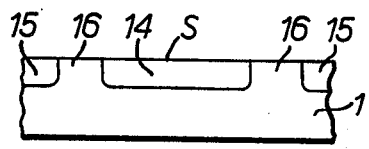
Figure 11:
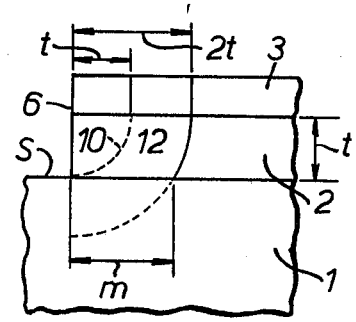
Figure 12:
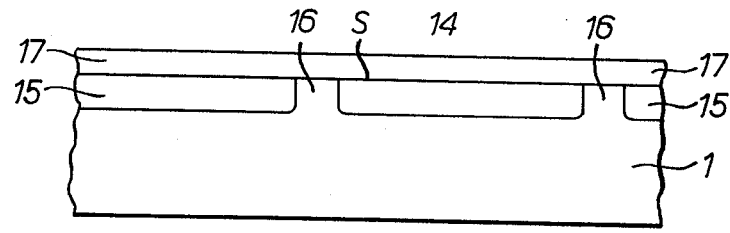
Figure 13:
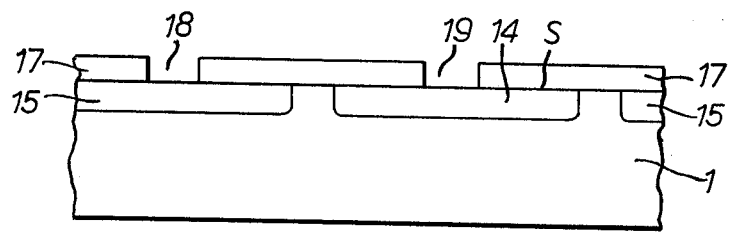
Figure 14:
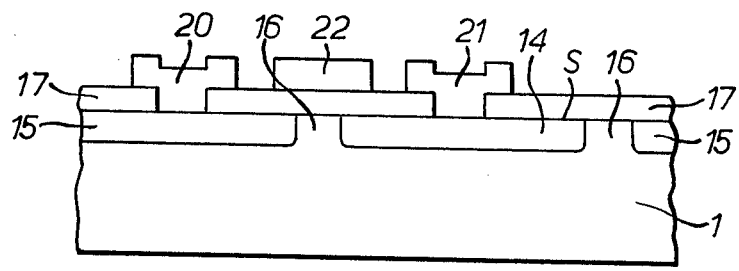

Embodiments of the invention will now be described solely by way of example and with reference to the accompanying drawings in which:

FIGS. 1 - 10 are idealised sectional diagrams illustrating stages in the manufacture of a solid-state device by the method according to the invention, the stages represented by FIGS. 1 - 3 being already known, FIG. 11 is an enlarged detail, FIGS. 12 - 14 are sectional diagrams, to a different scale, illustrating some additional stages which may be encountered in practice.

Referring to FIGS. 1 - 3 an electrical solid-state device, for example an integrated circuit chip, comprises a substrate 1, part of whose upper surface S is to be subjected to treatment. A film 2 of film material is then formed, by deposition or otherwise, on the surface S. The thickness of this film is controlled at a value $t$.

A layer 3 of photo-resist is spread over the film 2, and a trace 4 of a channel is projected photographically onto the layer 3. The trace 4 is focussed to present a band of width $w$ which is sharply defined at the edges 5, 6. After exposure to light, the band material is washed away, leaving a channel 7 of width $w$ in the layer 3. The channel 7 has defined edges 5, 6 of photo-resist and a floor of film material.

An etchant e.g. a mixture of hydrofluoric acid and ammonium fluoride, is then introduced into the channel 7. The etchant attacks the film material which forms the floor of the channel, to produce a trough 8 in the film 2. The etching action continues until the surface S is uncovered at the floor of the trough. The etchant however acts equally in all directions. So while the floor of the trough sinks towards the substrate, the film material at the sides of the trough is attacked as it becomes uncovered. As a result the defined edges 5, 6, of the layer 3 of photo-resist are undermined. When the surface S is uncovered, the etchant is removed and the etching action is stopped. Measured along the underside of the layer 3, the edges 5, 6 have been undermined to an extent equal to the thickness $t$ of the film 2. The walls 9, 10 of the trough 8 therefore take the form of quadrants of a circle of radius $t$. At the floor of the trough 8 the quadrants are tangential to the top of the substrate 1. Therefore the quantity of film material forming the walls at these points is very small and easily dislodged. Consequently the width of the trough 8 is not accurately controlled at the value $w$ and in practice must be regarded as having a rather greater width denoted by W.

Using ultra-violet light, the minimum trace width $w$ that can be achieved is of the order of 1 micron. If smaller widths are required radiation of a shorter wave length must be used. While this is possible, cumbersome methods and expensive apparatus are involved. And even with the reduced widths, the undermining of the defined edges 5, 6 is still experienced.

By means of the method disclosed in British Patent No. 1,388,535, a trough width substantially less than one micron is obtainable even if ultra-violet light is employed. And the reduced trough width is closely controlled by controlling the thickness $t$ of the film 2. For this purpose the film $t$ is given a thickness of substantially less than one micron, e.g. one half micron. The film 2 of the required thickness is formed in any suitable known way. Any suitable material may be used for the film 2, e.g. vapour phase deposited silicon dioxide having a high dopant concentration. In accordance with the invention, the material is doped with ions of a substance which is to be implanted into the substrate 1 at the surface S. A trough 8 with walls 9, 10 is then formed in the manner just described. However, instead of stopping the etching action when the surface S is uncovered at the floor of the trough 8, the etching action is continued for a further period during which the defined edges 5, 6 are further undermined as the walls 9, 10 recede. The duration of this further period determines the extent of the additional undermining. At the expiry of this further period, the etchant is removed and the etching action stopped. During this further period the walls 9, 10 have receded to 11, 12 respectively. The duration of the further period is chosen, in relation to the thickness $t$ of the film 2, so as to produce a desired profile for the walls 11, 12. For example, if the duration of the further period is made equal to the time taken to expose the substrate 1, the undermining of the defined edges 5, 6 is increased from $t$ to $2t$ (see FIG. 11). The wall 11 or 12 is an arc — not a quadrant — of a circle of radius $2t$. By suitably relating the duration of the further period of etching to the thickness $t$ of the film 2, the walls 11, 12 are given a profile which forms an appreciable angle with the substrate 1, in contrast to the tangential contact of the walls 9, 10. Consequently, the film material at the walls 11, 12 is not readily dislodged, and the walls 11, 12 retain their profile. During the further period of etching, the recession of the walls 9, 10 to the positions 11, 12 caused the substrate 1 to be uncovered over a magin $m$ at each side of the trough 8. The defined edges 5, 6 not being effected, the margins $m$ are each overhung by photo-resist 3.

After the walls 11, 12 have been formed (FIG. 4), there follows an optional stage depending on whether one or two margins are required. If only one margin is required, one wall of the trough 8 is removed together with the corresponding defined edge. Thus, in FIG. 5, the wall 11 and defined edge 5 have been removed in a suitable known way, e.g. by a solvent, leaving only the wall 12 and the defined edge 6.

The surface S is now bombarded by ions released from a source above the surface S and the photo-resist 3. The ions which pass between the defined edges 5, 6 of photo-resist become implanted in the substrate 1 as shown at 13. Other ions become implanted redundantly in the photo-resist 3. The margins $m$ however, are shielded from the bombarding ions by the overhanging photo-resist 3. Consequently no ions are implanted at the margins $m$. The ions used for the bombardment may be those of any suitable substance; most probably the substance is the same as that with which the material of the film 2 is doped.

After removal of the layer 3, the substrate 1 and film 2 are heated, in a manner already known. The heating for example at 1000° C., has two main effects. Firstly, the ions, implanted by bombardment at 13, are caused to diffuse into the substrate 1 to produce a diffusion 14. Secondly, the ions of the substance with which the film 2 is doped are transferred from the film 2 to the substrate 1, in which they become implanted. Once implanted, the transferred ions react to the heat in the same way as the ions implanted by bombardment. Consequently a diffusion 15 is formed by the transferred ions. Since no ions are implanted, either by bombardment or by transfer, at the margin $m$, the diffusions 14, 15 are separated from each other, by a boundary wall 16 of substrate material. A boundary wall 16 has the same width as a margin $m$.

Figure 8:
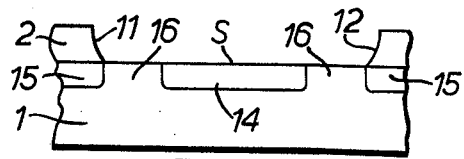
Figure 9:
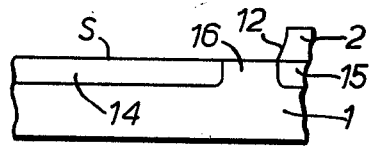

After the heating process is finished, the surviving film material 2 is removed as shown at FIG. 10 in respect of the construction of FIG. 8. The removal is effected in any suitable manner, and may be dispensed with if the surviving material is to be embodied in the finished solid state device.

Among the materials suitable for use in the method just described are silicon for the substrate, silicon oxide doped with phosphorus for the film material, and phosphorus for the bombarding ions. The process is suitable for the manufacture of discrete solid state devices as well as for the manufacture of integrated circuit chips. Devices of either $p$ type or $n$-type conductivity may be made. If desired, the surface S could be the upper surface of a layer or film supported by the substrate. Under these conditions the implantation and diffusion take place in the material of the layer or film and not of the substrate.

If a discrete transistor is required, the method just described is followed up to and including the stage illustrated in FIG. 10. The surface S is then covered with a layer 17 of insulating material, conveniently silicon dioxide. Two windows 18, 19 are cut in the layer 17, in known manner, giving access respectively to a diffusion 15 and to a diffusion 14. Two metal deposits 20, 21 are then formed, which fill the windows 18, 19 respectively and are in physical and electrical contact with the diffusions 15, 14 respectively. A third metal deposit 22 is also formed, which straddles the boundary wall 16 separating the diffusions 15, 14. The deposit 22 makes no contact with the deposits 20, 21 and is insulated from the substrate 1 by the layer 17 which has no window corresponding to the deposit 22. The diffusion 15 and deposit 20 serve respectively as the emitter and emitter electrode of the transistor. The diffusion 14 and deposit 21 serve as the collector and collector electrodes respectively. The boundary wall 16 separating the diffusions 14, 15 acts as the gate of the transistor. And the metal deposit 22 acts as the gate electrode. The diffusion 15 at the extreme right is not used. It is insulated by its own boundary wall 16. Alternatively this diffusion could be treated in the manner just described in which case it would become the emitter of a second transistor.

What is claimed is:

1. A method of manufacturing an electrical solid state device having a stratum presenting a surface at which the stratum is to be subjected to an implantation treatment, which method comprises the steps of:
    (i) forming a film on the said surface, the material of the film being doped with ions of a substance to be diffused in the stratum;
    (ii) covering the film with a layer of a photo-resist;
    (iii) photographically exposing a trace of at least one channel on the layer, and removing the exposed resist from the trace to leave at least one channel having walls constituted by defined edges of photo-resist and a floor of film material;
    (iv) forming a trough in the film material by introducing an etchant into each channel whereby an etching action is started on the film material at the floor of the said channel, which action continues through the film thickness until such time as said surface is exposed over a width equal to the width between said defined edges, an incidental action taking place during this time at the walls of the trough which incidental action is deliberately continued after the expiration of said time for a period during which the trough walls are caused to recede and to assume a profile dependent partly on the period duration and partly on the film thickness, the recession of a wall forming at the floor of the trough a margin at which said surface is uncovered and which is overhung by photo-resist;
    (v) bombarding said surface, from a source above the said surface and the photo-resist, with ions of a substance to be implanted in the stratum, whereby the uncovered nonoverhung stratum undergoes implantation by the bombarding ions; and
    (vi) heating the stratum and the surviving film material whereby, firstly ions of the dopant substance are transferred from the film material to the stratum and are implanted therein, and secondly ions, implanted either by bombardment or by transfer, are caused to diffuse into the stratum except at said margin where no implanted ions will be present, thereby forming in the stratum a number of individual diffusions of the same type, any two of which are separated from each other by a boundary wall of stratum material whose width of is the width of a margin.

2. The method in accordance with claim 1 wherein, before stage (i), the stratum is provided with an oxide film which is then locally removed to expose the surface of the stratum which receives the film in the said stage (i) and further comprising removing the photo-resist after stage (v) and before the heating of stage (vi).

3. The method in accordance with claim 1 in which the heated surviving film material of stage (vi) is removed and metal connections are formed in the electrical solid state device.

* * * * *